United States Patent
Waite et al.

(10) Patent No.: US 9,299,564 B2
(45) Date of Patent: Mar. 29, 2016

(54) ION IMPLANT FOR DEFECT CONTROL

(71) Applicant: Varian Semiconductor Equipment Associates, Inc., Gloucester, MA (US)

(72) Inventors: Andrew M. Waite, Beverly, MA (US); Stanislav S. Todorov, Topsfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 220 days.

(21) Appl. No.: 13/897,666

(22) Filed: May 20, 2013

(65) Prior Publication Data
US 2014/0162435 A1    Jun. 12, 2014

Related U.S. Application Data

(60) Provisional application No. 61/736,053, filed on Dec. 12, 2012.

(51) Int. Cl.
| | |
|---|---|
| *H01L 21/322* | (2006.01) |
| *H01L 21/223* | (2006.01) |
| *H01L 29/66* | (2006.01) |
| *H01L 21/265* | (2006.01) |

(52) U.S. Cl.
CPC ...... *H01L 21/2236* (2013.01); *H01L 21/26513* (2013.01); *H01L 29/66803* (2013.01); *H01L 21/26586* (2013.01)

(58) Field of Classification Search
CPC .............. H01L 21/2236; H01L 21/26513; H01L 21/26586; H01L 29/66803
See application file for complete search history.

(56) References Cited

U.S. PATENT DOCUMENTS

| | | | |
|---|---|---|---|
| 4,724,300 A | 2/1988 | Dearnaley | |
| 5,196,355 A | 3/1993 | Wittkower | |
| 6,096,607 A | 8/2000 | Ueno | |
| 7,968,459 B2 | 6/2011 | Bedell et al. | |
| 8,598,025 B2 * | 12/2013 | Steen et al. | 438/558 |
| 8,722,431 B2 * | 5/2014 | Pradhan et al. | 438/4 |
| 8,815,670 B2 * | 8/2014 | Basker et al. | 438/197 |
| 2006/0175667 A1 * | 8/2006 | Tsuchiaki | 257/391 |
| 2007/0257315 A1 | 11/2007 | Bedell et al. | |
| 2008/0179683 A1 * | 7/2008 | Sasaki et al. | 257/368 |

(Continued)

FOREIGN PATENT DOCUMENTS

| | | | | |
|---|---|---|---|---|
| WO | 2010092653 A1 | 8/2010 | | |
| WO | WO 2014/093536 | * | 6/2014 | H01L 29/66 |

OTHER PUBLICATIONS

Han, et al., "A Novel Plasma-Based Technique for Conformal 3D FinFET Doping," Junction Technology (IWJT), 2012 12th Intl Workshop ON, IEEE, May 14, 2012, pp. 35-37.

(Continued)

*Primary Examiner* — Mary Wilczewski

(57) ABSTRACT

Various methods for implanting dopant ions into a three dimensional feature of a semiconductor wafer are disclosed. The implant temperature may be varied to insure that the three dimensional feature, after implant, has a crystalline inner core, which is surrounded by an amorphized surface layer. The crystalline core provides a template from which the crystalline structure for the rest of the feature can be regrown. In some embodiments, the implant energy and the implant temperature may each be modified to achieve the desired crystalline inner core with the surrounding amorphized surface layer.

17 Claims, 2 Drawing Sheets

(56) References Cited

U.S. PATENT DOCUMENTS

| | | |
|---|---|---|
| 2008/0258220 A1 | 10/2008 | Bedell et al. |
| 2009/0026540 A1* | 1/2009 | Sasaki et al. ................. 257/344 |
| 2011/0171795 A1 | 7/2011 | Tsai et al. |
| 2011/0272763 A1* | 11/2011 | Sasaki et al. ................. 257/347 |
| 2012/0258600 A1 | 10/2012 | Godet et al. |
| 2014/0094024 A1* | 4/2014 | Oka et al. ...................... 438/513 |
| 2014/0162435 A1* | 6/2014 | Waite et al. ................... 438/474 |
| 2014/0256105 A1* | 9/2014 | Wann et al. ................... 438/283 |
| 2014/0357068 A1* | 12/2014 | Horigome et al. ............ 438/513 |

OTHER PUBLICATIONS

Pelaz, et al., "Atomistic Process Modeling Based on Kinetic Monte Carlo and Molecular Dynamics for Optimization of Advanced Devices," Electron Devices Meeting (IEDM), 2009 IEEE Intl, Piscataway, NJ, Dec. 7, 2009, pp. 1-4.

International Search Report and Written Opinion, mailed Apr. 7, 2014 for PCT/US2013/074472 Filed Dec. 11, 2013.

* cited by examiner

ION IMPLANT FOR DEFECT CONTROL

This application claims priority of U.S. Provisional Patent Application Ser. No. 61/736,053, filed Dec. 12, 2012, the disclosure of which is incorporated by reference in its entirety.

FIELD

This invention relates to ion implant, and more particularly, to ion implant for defect control in three-dimensional structures.

BACKGROUND

Ion implants introduce desired dopants into selected regions of a transistor on a semiconductor wafer. A platen, such as, for example, an electrostatic platen, supports the semiconductor wafer during ion implant. The electrostatic platen may be configured with an internal heater to heat the platen and hence the semiconductor wafer to temperatures greater than 150° C. for hot ion implants. Current platens having an internal heater may suffer from reliability concerns, especially at hotter temperatures exceeding 400° C.

Next generation three dimensional transistors, such as finFETs have structures such as fins, which can be doped with desired dopants from an ion implanter. A challenge has been the number of defects present after a subsequent annealing step of the fin. For instance, doping the fins at room temperature has been shown to fully amorphize the entire fin. Higher temperature implants have also been attempted, which may have suboptimal results.

Accordingly, there is a need in the art for new and improved methods of defect control.

SUMMARY

Various methods for implanting dopant ions into a three dimensional feature of a semiconductor wafer are disclosed. The implant temperature may be varied to insure that the three dimensional feature, after implant, has a crystalline inner core, which is surrounded by an amorphized surface layer. The crystalline core provides a template from which the crystalline structure for the rest of the feature can be regrown. In some embodiments, the implant energy and the implant temperature may each be modified to achieve the desired crystalline inner core with the surrounding amorphized surface layer.

In one embodiment, a method of implanting dopant ions into a three dimensional feature of a semiconductor wafer, is disclosed, which comprises implanting the dopant ions into the three dimensional feature at an implant energy and implant temperature so as to create an amorphized surface layer surrounding a crystalline inner core.

In another embodiment, a method of doping a fin in a finFET transistor is disclosed, which comprises implanting the dopant ions into the fin at an implant energy and implant temperature so as to create a surface layer amorphized by the dopant ions surrounding a crystalline inner core; and performing an anneal to recrystallize the surface layer after the implanting step.

In another embodiment, a method of implanting a dopant species is disclosed, which comprises providing a fin of a finFET transistor, the fin having a fin width; ion implanting a dopant species into the fin at an implant energy and at an elevated temperature above 150° C. so the fin has a surface layer and an inner core after the ion implanting, where the surface layer is amorphized by the ion implanting and the inner core is not amorphized and its width is less than half the fin width; and annealing the fin.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
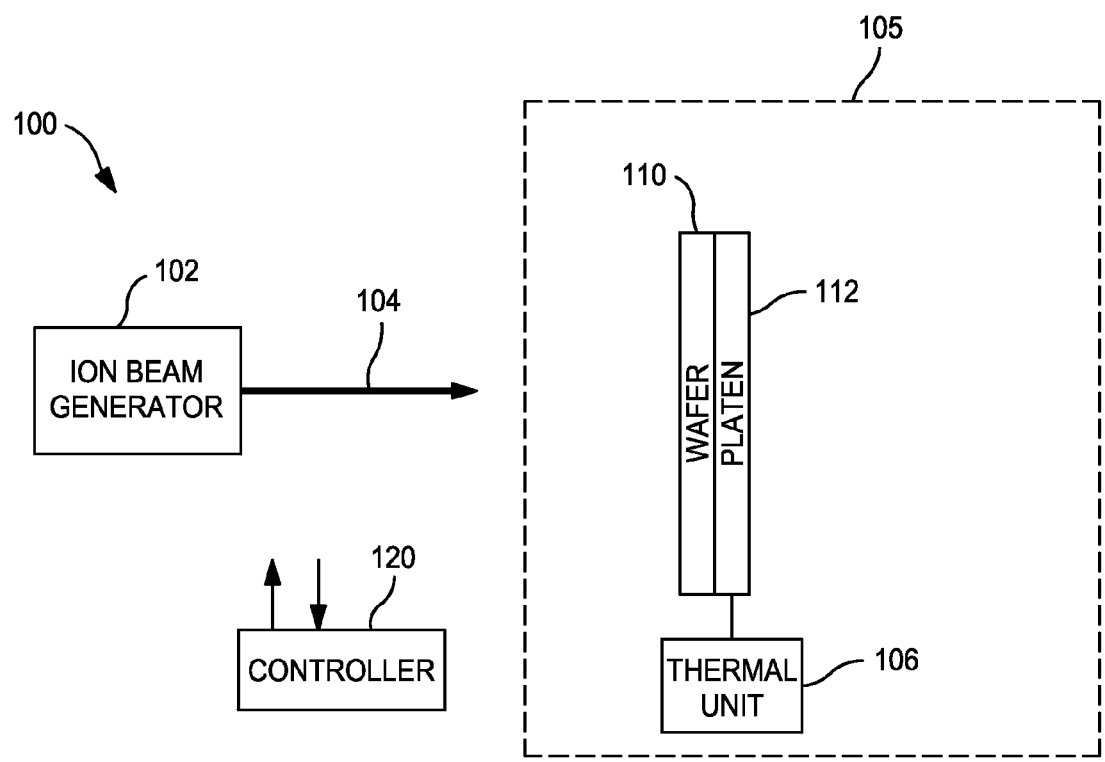
FIG. 1 is a simplified schematic diagram of an ion implanter.

Turning to FIG. 1, a block diagram of a simplified ion implanter 100 capable of performing a hot implant is illustrated. Hot implants typically occur at temperatures greater than 150° C. In some of the embodiments detailed herein, a hot ion implant at 300° C. and a range centered about 300° C. such as between 280° C. and 320° C., and 290° C. and 310° C. is shown to provide defect control by reducing the density of defects and the size of defects after a subsequent anneal step.

The ion implanter 100 includes an ion beam generator 102, an end station 105, a platen 112, a semiconductor wafer 110 to be treated by an ion beam 104, a thermal unit 106, and a controller 120. The ion beam generator 102 is configured to generate the ion beam 104 and direct it towards a front surface of the wafer 110.

The ion beam generator 102 may include many components known to those skilled in the art, such as an indirectly heated cathode ion source, an extraction assembly positioned proximate an extraction aperture of the ion source, a mass analyzer, acceleration/deceleration lenses, etc. to provide the ion beam 104 having desired characteristics, such as beam current, uniformity, and energy levels. The ion beam 104 provided by the ion beam generator 102 may be a ribbon beam or a spot beam as is known in the art. The ion beam 104 may be distributed across the entire front surface of the wafer 110 by ion beam movement, wafer movement, or a combination of the two. In one embodiment, the ion beam 104 may be a ribbon beam with an approximate rectangular cross sectional shape. The wafer 110 may be mechanically driven in a direction orthogonal to the long dimension of the ribbon beam to distribute the ribbon beam across the entire front surface of the wafer 110. The entire path traversed by the ion beam 104 is evacuated by a vacuum pumping system (not illustrated) to create a high vacuum condition as known to those skilled in the art.

The end station 105 may include the platen 112 and the thermal unit 106. The end station 105 may also include automated wafer handling equipment (not illustrated) for introducing wafers to, and removing wafers from, the platen 112. Automated wafer handling equipment may also be configured to introduce wafers from atmospheric conditions through a load lock to the platen 112 and out a load lock back to atmospheric conditions after ion treatment.

The thermal unit 106 is configured to heat the semiconductor wafer 110 for a hot implant or facilitate a room temperature implant. For hot implants, the thermal unit 106 may include a heat source e.g., a heating coil, embedded in the platen 112 or a heat source, e.g., lamps, external to the platen.

The controller 120 can be or may include a general-purpose computer or network of general-purpose computers that may be programmed to perform desired input/output functions. The controller 120 can also include other electronic circuitry or components, such as application specific integrated circuits, other hardwired or programmable electronic devices, discrete element circuits, etc. The controller 120 may also include communication devices, data storage devices, and software. The controller 120 may receive input signals from a variety of systems and components such as the ion beam generator 102, and the thermal unit 106 and provide output signals to each to control the same, e.g., to control a temperature for a hot implant of a desired species. The ion implanter 100 has been described as a beam line ion implanter but a plasma doping implanter may also be utilized to treat the silicon wafer 110. Those skilled in the art will recognize a plasma doping implanter positions the semiconductor wafer 110 in a processing chamber where plasma is generated.

As described above, new technique, such as finFETs, include small three dimensional features. These features may extend upward from the plane of the semiconductor wafer, having a height of between 20 nm and 40 nm. Each of these features, or fins, may have a width of between about 5 and 20 nm (depending on technology generation). Doping such three dimensional features may be problematic. For instance, as described above, doping the fins at room temperature has been shown to fully amorphize the entire fin. Annealing such a fin, for example, with a 1,000° C. spike anneal, results in a polycrystalline fin with undesired quantities of defects. This may be due to the fact that there is no crystalline silicon remaining in the fin from which crystal regrowth can begin.

Hot implants are traditionally used to reduce the amorphization of the semiconductor material. For example, a hot implant performed at 450° C. results in a fin that has no amorphized portion after the implant. While this is thought to be advantageous, surprisingly, this is not true for these structures. For example, annealing such a fin, e.g., with a 1,000° C. spike anneal, results in a crystalline fin which contains a relatively high density of defects. Doping the fins at a hot ion implant temperature of 450° C. has also been attempted. The resulting fin has no amorphized portion after the implant. Even after a subsequent 1,000° C. spike anneal the resulting fin exhibited a relatively high density of defects ($1E10/cm^2$) and size of defects (10-40 nm).

Figure 2:
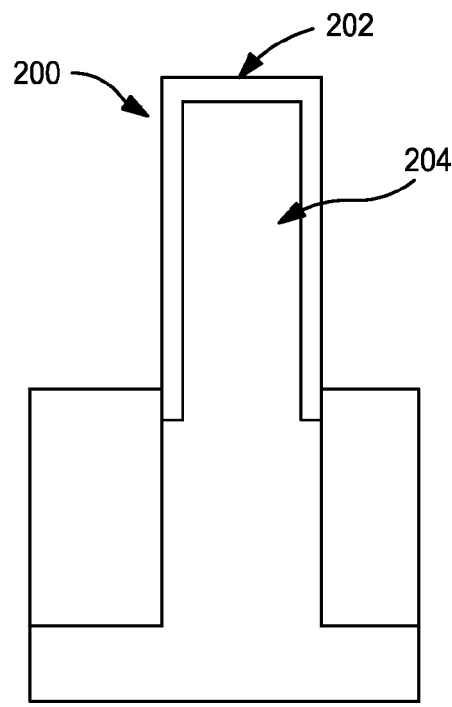
FIG. 2 is a cross sectional view of a fin of a finFET after a specified hot ion implant.

Turning to FIG. 2, a cross sectional view of a fin 200 of a finFET is illustrated after a hot ion implant at 300° C. In one embodiment, a beam line ion implanter consistent with FIG. 1 provides dopant species in an ion beam having a relatively low energy of 3 keV, a dose of 1E15, at a tilt angle of 45 degrees to dope the fin 200. Two implants at tilt angles of plus and minus 45 degrees relative to normal were made at the above energy and dose to implant both sides of the fin 200. Other tilt angles may also be used to implant the sides of the fin 200. Similarly, other implant energies and doses may also be used in other embodiments. After the hot ion implant at 300° C., the fin 200 included an amorphized surface layer 202 surrounding an inner core 204 that was not amorphized. The amorphized surface layer 202 may be limited to a few nanometers of the surface of the fin. In one embodiment, the surface layer 202 had a thickness of 2.3 nm.

In other words, the temperature of the ion implant was chosen so as to cause the inner core 204 of the fin 200 to remain crystalline, while the surrounding surface layer 202 becomes amorphized. If some embodiments, it may be desirable to allow the width of the crystalline inner core 204 to be about half the width of the fin 200. In this case, the surface layer 202 may be about one fourth of the width of the fin 200 on each side of the inner core 204. In other embodiments, the width of the crystalline inner core 204 may be about one fourth the width of the fin 200, and the surface layer 202 may be about ⅜ of the width of the fin 200. In still other embodiments, it may be desirable to have a crystalline inner core 204 which is only a single or few mono-layers of material in thickness. In this case, the surface layer 202 is nearly half of the width of the fin 200 on either side of this mono-layer.

Figure 3:
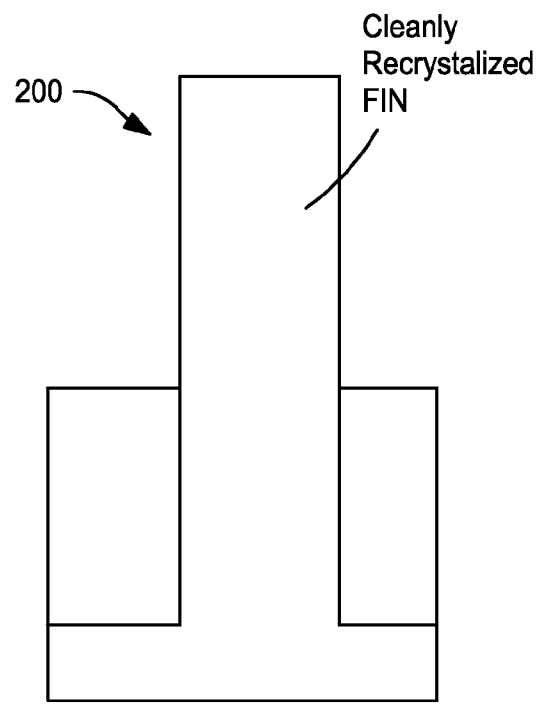
FIG. 3 is a cross sectional view of the fin of FIG. 2 after anneal.

Turning to FIG. 3, a cross sectional view of the fin 200 after a 1,000° C. spike anneal operation is illustrated. As illustrated, the fin 200 cleanly recrystallized after anneal. Although described with reference to a fin of a finFET, a hot ion implant at a temperature of 300° C. may also be performed on other three dimensional features, and may also be performed on planar devices including implants into stressed embedded epi layers such as eSiGe or eSiC.

In another embodiment, a relationship exists between the implant energy and the implant temperature. For example, lower energy implants penetrate less deeply into the semiconductor material than higher energy implants. Therefore, a lower implant temperature may be used to create the same crystalline inner core with amorphized surface layer. For example, a 2 keV implant energy may be performed at a temperature different from 300° C. Since less material is amorphized, there may be a wider implant temperature range that may be utilized. Conversely, higher implant energies penetrate more deeply, and therefore a higher implant temperature may be appropriate to create the desired crystalline inner core with amorphized surface layer. For example, a 4 keV implant may require an implant temperature greater than 300° C. Thus, although temperature ranges of around 300° C. are discussed, other embodiments are possible, especially if the implant energy is varied as well.

The implant energy and the implant temperature are selected such that the feature being implanted, such as a fin, retains a crystalline inner core surrounded by an amorphized surface layer. In other embodiments, the surface layer may be damaged by the ion implant, rather than amorphized. Stated differently, the crystalline inner core provides the crystalline template which is necessary to regrow the surface layer as a single crystal.

Furthermore, the implant energy and implant temperature may be adjusted based on the width of the feature being implanted. Thinner features have less material, and therefore the thickness of the amorphized surface layer may be scaled as well. Thus, in some embodiments, the implant energy may be reduced as the feature becomes thinner. This may allow a wider range of implant temperatures. In other embodiments, the implant temperature may increase as the feature becomes thinner. In some embodiments, both implant energy and implant temperature are varied such that the feature retains a crystalline inner core surrounded by an amorphized surface layer.

Advantageously, there has been provided a method of performing a hot ion implant into a fin of a finFET that leaves a crystalline inner core and a surface layer that is amorphized after the hot ion implant. This may be accomplished with a hot ion implant at an elevated temperature of 300° C. After anneal, the result is a cleanly recrystallized structure. Pictures of samples implanted at 3 keV and at 300° C. revealed a density of defects of $4-5E11/cm^2$ and a defect size of 5-8 nm after the 300° C. hot ion implant. Importantly, after a spike anneal at 1,000° C., the density of the defects was reduced to $<1E7/cm^2$ and the size of the defects was reduced to <3 nm. In contrast, a similar sample was implanted at a higher temperature of 450° C. leaving no amorphized surface layer in the fin after implant. The fin was then similarly annealed with a spike anneal at 1,000° C. The resulting fin after anneal had a much higher defect density of $1E10/cm^2$ and a much larger defect size of 10-40 nm. Accordingly, the hot ion implant at 3 keV and at 300° C. resulted in a fin with a much lower defect density and a much smaller defect sizes after anneal. Furthermore, a platen with an internal heater tends to be more reliable at 300° C. than at higher temperatures such as 450° C., leading to improved platen reliability.

While the above discloses a particular embodiment using an implant energy of 3 keV and a implant temperature of 300° C., other embodiments are within the scope of the disclosure. As described above, changes in one of these two parameters may be accompanied a corresponding change in the other parameter to achieve the desired result.

In addition, the testing performed above assume a fin having a width of 30 nm. Changing the width of the fin may also affect the implant energy and implant temperature used to dope the fin. For example, a thicker fin has more material, and for a given implant energy, may utilize a lower temperature. For a given implant temperature, a higher implant energy may be used. Likewise, a thinner fin may require a hotter implant temperature or a lower implant energy to achieve a crystalline inner core with an amorphized surface layer.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting dopant ions into a three dimensional feature of a semiconductor wafer, comprising:
    implanting said dopant ions into said three dimensional feature at a plurality of incident angles at an implant energy and implant temperature so as to create an amorphized surface layer surrounding a crystalline inner core,
    wherein, after implanting, said three dimensional feature consists of an amorphized surface layer and a crystalline inner core, and wherein said three dimensional feature has a feature width, and said crystalline inner core has a width of less than one half of said feature width.

2. The method of claim 1, wherein said surface layer has a thickness of greater than one quarter of said feature width.

3. The method of claim 1, wherein said crystalline inner core has a width of less than one quarter of said feature width.

4. The method of claim 1, wherein said crystalline inner core comprises a single mono-layer of material.

5. The method of claim 1, wherein said implant temperature varies with said implant energy.

6. The method of claim 1, wherein said implant temperature is greater than 150° C.

7. The method of claim 1, further comprising performing a spike anneal after said implanting step to recrystallize said surface layer.

8. The method of claim 1, wherein said three dimensional feature comprises a fin of a finFET transistor.

9. A method of doping a fin in a finFET transistor, comprising:
    implanting dopant ions into said fin at an implant energy and implant temperature so as to create a surface layer amorphized by said dopant ions surrounding a crystalline inner core; and
    performing an anneal to recrystallize said surface layer after said implanting step,
    wherein, after implanting, said fin consists of an amorphized surface layer and a crystalline inner core, and wherein said fin has a feature width, and said crystalline inner core has a width of less than half of said feature width.

10. The method of claim 9, wherein said surface layer has a thickness greater than one quarter of said feature width.

11. The method of claim 9, wherein said crystalline inner core has a width of less than one quarter of said feature width.

12. The method of claim 9, wherein said crystalline inner core comprises a single mono-layer of material.

13. The method of claim 9, wherein said implant temperature varies with said implant energy.

14. The method of claim 9, wherein said implant temperature is greater than 150° C.

15. A method of implanting a dopant species, comprising:
    providing a fin of a finFET transistor, the fin having a fin width;
    ion implanting said dopant species into said fin at an implant energy and at an elevated temperature above 150° C. so said fin consists of a surface layer and an inner core after said ion implanting where said surface layer is amorphized by said ion implanting and said inner core is not amorphized and a width of said inner core is less than half said fin width; and
    annealing said fin.

16. The method of claim 15, wherein said surface layer has a thickness less than 3 nanometers.

17. The method of claim 15, wherein said elevated temperature is 300° C.

* * * * *